(12) United States Patent
Chen et al.

(10) Patent No.: US 8,987,776 B2
(45) Date of Patent: Mar. 24, 2015

(54) LIGHT-EMITTING DEVICE

(71) Applicant: Epistar Corporation, Hsinchu (TW)

(72) Inventors: Ying Ming Chen, Hsinchu (TW); Tzu Chieh Hsu, Hsinchu (TW); Jhih-Sian Wang, Hsinchu (TW); Chien-Fu Huang, Hsinchu (TW); Shih-I Chen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 14/169,035

(22) Filed: Jan. 30, 2014

(65) Prior Publication Data

US 2014/0175493 A1 Jun. 26, 2014

Related U.S. Application Data

(60) Continuation of application No. 14/011,502, filed on Aug. 27, 2013, now Pat. No. 8,643,054, which is a division of application No. 13/608,750, filed on Sep. 10, 2012, now Pat. No. 8,530,927, which is a division of application No. 13/009,491, filed on Jan. 19, 2011, now Pat. No. 8,263,998, which is a continuation of application No. 12/437,908, filed on May 8, 2009, now Pat. No. 7,906,795, application No. 14/169,035, which is a continuation of application No. 13/901,191, filed on May 23, 2013, which is a continuation of application No. 13/005,075, filed on Jan. 12, 2011, now Pat. No. 8,450,767, which is a continuation-in-part of application No. 12/437,908, filed on May 8, 2009, now Pat. No. 7,906,795.

(51) Int. Cl.
*H01L 33/24* (2010.01)
*H01L 33/38* (2010.01)
*H01L 33/62* (2010.01)
*H01L 23/00* (2006.01)
*H01L 33/10* (2010.01)
*H01L 33/22* (2010.01)
*H01L 33/00* (2010.01)
*H01L 33/20* (2010.01)

(52) U.S. Cl.
CPC .............. *H01L 33/24* (2013.01); *H01L 33/387* (2013.01); *H01L 33/62* (2013.01); *H01L 24/05* (2013.01); *H01L 33/10* (2013.01); *H01L 33/22* (2013.01); *H01L 33/0079* (2013.01); *H01L 33/20* (2013.01)
USPC .............................................. 257/99; 257/98

(58) Field of Classification Search
USPC .......................................................... 257/99
See application file for complete search history.

(56) References Cited

U.S. PATENT DOCUMENTS 5,309,001 A * 5/1994 Watanabe et al. ............... 257/99

(Continued)

*Primary Examiner* — Zandra Smith
*Assistant Examiner* — Lawrence Tynes, Jr.
(74) *Attorney, Agent, or Firm* — Muncy, Geissler, Olds & Lowe, P.C.

(57) ABSTRACT

A light-emitting device includes a semiconductor light-emitting stack; a current injected portion formed on the semiconductor light-emitting stack; an extension portion having a first branch radiating from the current injected portion and a second branch extending from the first branch; an electrical contact structure between the second branch and the semiconductor light-emitting stack and having a first width; and a current blocking structure located right beneath the electrical contact structure and having a second width larger than the first width.

19 Claims, 7 Drawing Sheets

(56) References Cited

U.S. PATENT DOCUMENTS

| | | |
|---|---|---|
| 5,744,828 A | 4/1998 | Nozaki et al. |
| 6,025,899 A | 2/2000 | Fukunaga et al. |
| 2003/0185265 A1 | 10/2003 | Henrichs |
| 2004/0195641 A1 | 10/2004 | Wirth |
| 2005/0184297 A1 | 8/2005 | Hsieh |
| 2006/0163603 A1 | 7/2006 | Takeuchi et al. |
| 2008/0308832 A1* | 12/2008 | Hsieh et al. ............ 257/98 |
| 2009/0072257 A1* | 3/2009 | Unno et al. ............ 257/98 |

* cited by examiner

LIGHT-EMITTING DEVICE

CROSS REFERENCE TO RELATED APPLICATIONS

This application is a continuation of U.S. application Ser. No. 14/011,502, filed on Aug. 27, 2013, which is a divisional application of U.S. application Ser. No. 13/608,750, filed on Sep. 10, 2012, now U.S. Pat. No. 8,530,927, which is a divisional application of U.S. application Ser. No. 13/009,491, filed on Jan. 19, 2011, now U.S. Pat. No. 8,263,998, which is a continuation of U.S. application Ser. No. 12/437,908, filed on May 8, 2009, now U.S. Pat. No. 7,906,795; and this application is a continuation of U.S. application Ser. No. 13/901,191, filed on May 23, 2013, which is a continuation application of U.S. application Ser. No. 13/005,075, filed on Jan. 12, 2011, now U.S. Pat. No. 8,450,767, which is a continuation-in-part (CIP) application of U.S. application Ser. No. 12/437,908, filed on May 8, 2009, now U.S. Pat. No. 7,906,795, priority to all of which is claimed under 35 U.S.C. §120, and the entire contents of all of which are hereby incorporated by reference.

BACKGROUND OF THE DISCLOSURE

1. Technical Field

The present invention relates to a light-emitting device, and in particular to a semiconductor light-emitting device.

2. Description of the Related Art

The light-emitting mechanism and the structure of a light-emitting diode (LED) are different from that of the conventional light sources. The LED has advantages of small size and high reliability, and been widely used in different fields such as displays, laser diodes, traffic lights, data storage apparatus, communication apparatus, lighting apparatus, and medical apparatus. Because of the successful development of high brightness LEDs, LED can be applied to indoor or large outdoor displays. How to improve the light emitting efficiency of light emitting devices is an important issue in this art.

SUMMARY OF THE DISCLOSURE

Accordingly, the present invention provides a light-emitting device. The light-emitting device includes a semiconductor light-emitting stack having a light emitting area; an electrode formed on the semiconductor light-emitting stack, wherein the electrode comprises a current injected portion and an extension portion; a current blocking area formed between the current injected portion and the semiconductor light-emitting stack, and formed between a first part of the extension portion and the semiconductor light-emitting stack; and an electrical contact structure formed between a second part of the extension portion and the semiconductor light-emitting stack, wherein the first part of the extension portion is closer to current injected portion than the second part of the extension portion is, and wherein the ratio of the electrical contact structure and the light emitting area is between 3% to 15%.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The accompanying drawings are included to provide easy understanding of the invention, and are incorporated herein and constitute a part of this specification. The drawings illustrate embodiments of the invention and, together with the description, serve to illustrate the principles of the invention.

DESCRIPTION OF THE PREFERRED EMBODIMENTS

Figure 1A:
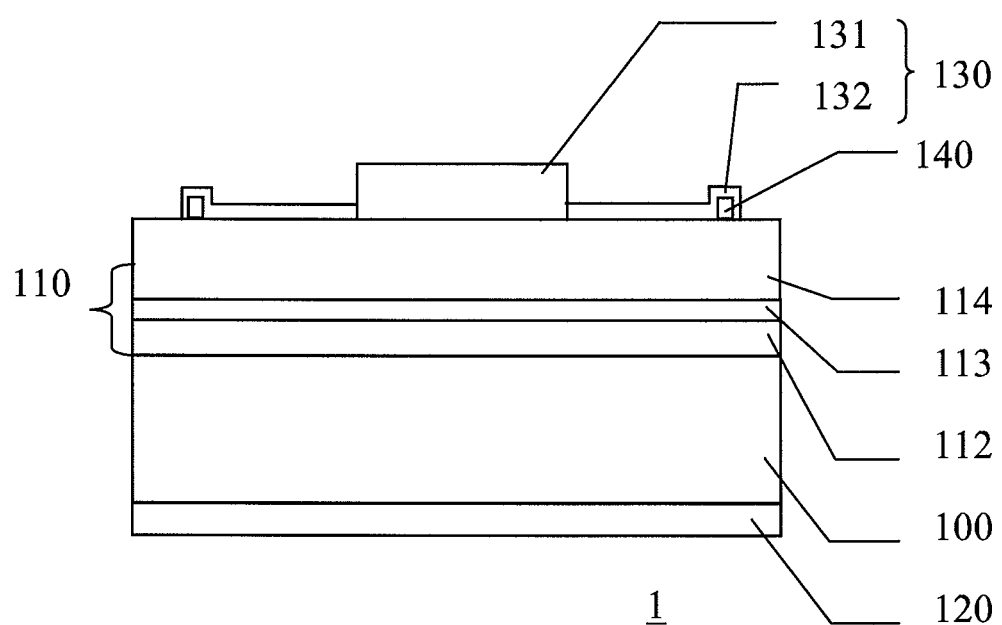
FIG. 1A is a cross-sectional view of a light-emitting device in accordance with a first embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

Figure 1B:
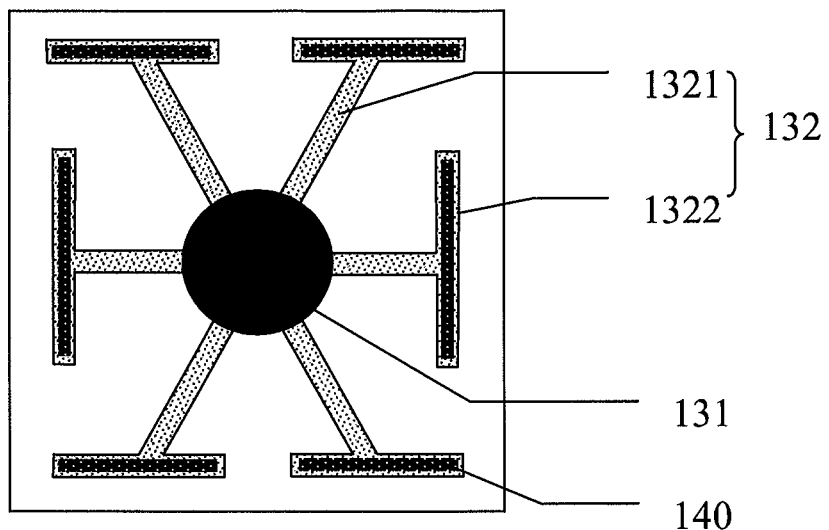
FIG. 1B is a top view of a light-emitting device in accordance with the first embodiment of the present invention.

Referring to FIGS. 1A-1B, the cross-sectional views show a light-emitting device 1 in accordance with a first embodiment of the present invention. The light-emitting device 1 such as an LED comprises a substrate 100, a semiconductor light-emitting stack 110, an electrical contact structure 140, a first electrode 120, and a second electrode 130. The material of the substrate 100 includes semiconductor materials such as Si, SiC, GaAsP, GaAs, or GaP. The semiconductor light-emitting stack 110 formed on the upper surface of the substrate 100 includes an n-type semiconductor layer 112, a p-type semiconductor layer 114, and an active layer 113 interposed therebetween. In some embodiments, the arrangements of the n-type and p-type semiconductor layers 112 and 114 can be interchanged. In the embodiment, the n-type and p-type semiconductor layers 112 and 114 act as cladding layers of the LED and include MN group compound semiconductor materials such as AlGaInP, AlGaAs, AlGaInN, or other ternary or quaternary III-V group compound semiconductor materials. The active layer 113 acts as a light-emitting layer including group compound semiconductor materials such as AlGaInP, AlGaInN or other materials matched with the n-type and p-type semiconductor layers 112 and 114. The first electrode 120 and the second electrode 130 are formed on the bottom of the substrate 100 and the top of the semiconductor light-emitting stack 110 respectively. In the embodiment, the second electrode 130 includes a current injected portion 131 and extension portion 132. In the embodiment, the current injected portion 131 is deposited approximately on the center of the p-type semiconductor layers 114. The extension portions 132 comprise first branches 1321 radiate from the current injected portion 131 toward the edges of the light-emitting device 1. Second branches 1322 are diverging and extending from the first branches. The second branches are deposited along with and paralleled to the edges of the light-emitting device 1. The electrical contact structure 140 is formed between the second branches and the semiconductor light-emitting stack 110. A method of forming the electrical contact structure 140 includes forming a semiconductor layer on the semiconductor light-emitting stack 110, which is ohmically contacted with the extension portions 132. Then etching the semiconductor layer in accordance with a predetermined pattern. After that, part of the p-type semiconductor layer 114 is exposed, and the remaining region of the semiconductor layer forms the electrical contact structure 140. Afterwards, the electrodes are formed on the p-type semiconductor layer 114 and the electrical contact structure 140.

Another method for forming the electrical contact structure 140 includes a step of forming an insulated layer on the semiconductor layer to cover the area with another predetermined pattern. The exposed region of the semiconductor layer is the electrical contact structure.

The conductive type of the electrical contact structure 140 can be the same as the p-type semiconductor layer 114 or different from it. If the conductivity of the electrical contact structure 140 is n-type, it also forms a reverse tunneling contact with the p-type semiconductor layer 114. Another material of the electrical contact structure 140 is metal which can be partially deposited on the p-type semiconductor layer 114 with a predetermined pattern to form the electrical contact structure 140.

In one embodiment, the material of the electrical contact structure 140 is a p-type semiconductor. The second branches 1322 are electrically contacted with the electrical contact structure 140. Because the first branches 1321 and the current injected portion 131 are current-blocked with the p-type semiconductor layer 114, the current is injected through the current injected portion 131, moves to the first branches 1321 and the second branches 1322, and then is spread to the semiconductor light-emitting stack 110 through the electrical contact structure 140. In the embodiment, the size of the light-emitting device 1 is 10 mil×10 mil, and the area of the active layer 113 is 67.24 mil². The width of each of the first branches 1321 is 0.2 mil, and the width of each of the second branches 1322 is 0.4 mil. The width of each of the electrical contact structure 140 is 0.3 mil. The electrical contact structure 140 and the second branches 1322c have substantially the same shape. The total area of the extension portions 132 is 11.64 mil² and the total area of the electrical contact structure 140 is 5.8 mil². The area ratio of the electrical contact structure 140 and the active layer 113 is 8.62%. The luminous efficiency of the light-emitting device 1 is 47.62 lm/W. When the width of the second branch 1322 is varied from 0.4 mil to 0.45 mil and the width of the electrical contact structure 140 is varied from 0.3 mil to 0.35 mil, the area ratio of the electrical contact structure 140 and the active layer 113 is 10.18% and the luminous efficiency of the light-emitting device 1 is 46.48 lm/W. When the width of each second branch 1322 is varied to 0.5 mil, and the width of the electrical contact structure 140 is varied to 0.4 mil, the area ratio of the electrical contact structure 140 and the active layer 113 is 11.77% and the luminous efficiency of the light-emitting device 1 is 46.13 lm/W.

Figure 1C:
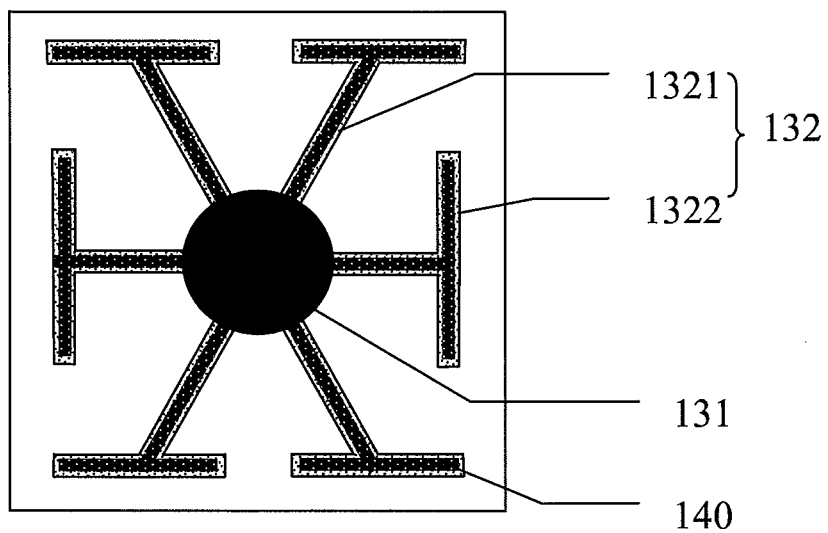
FIG. 1C is a top view of a conventional light-emitting device.

FIG. 1C shows the top view of a conventional light-emitting device without implementing the present invention. The electrical contact structure 140 is formed under the first branches 1321 and the second branches 1322. The luminous efficiency of the light-emitting device 1 is 46.01 lm/W which is lower than that of the light-emitting device 1 in accordance of the first embodiment of the present invention.

In some embodiments, the surface of the semiconductor light-emitting stack 110 and/or the interface between the semiconductor light-emitting stack 110 and the substrate 100 can be optionally roughened to improve the light extraction efficiency. The roughened surface can be formed during the epitaxial process, by a randomly etching method or a lithographical etching to form a regular or an irregular patterned surface.

Figure 2A:
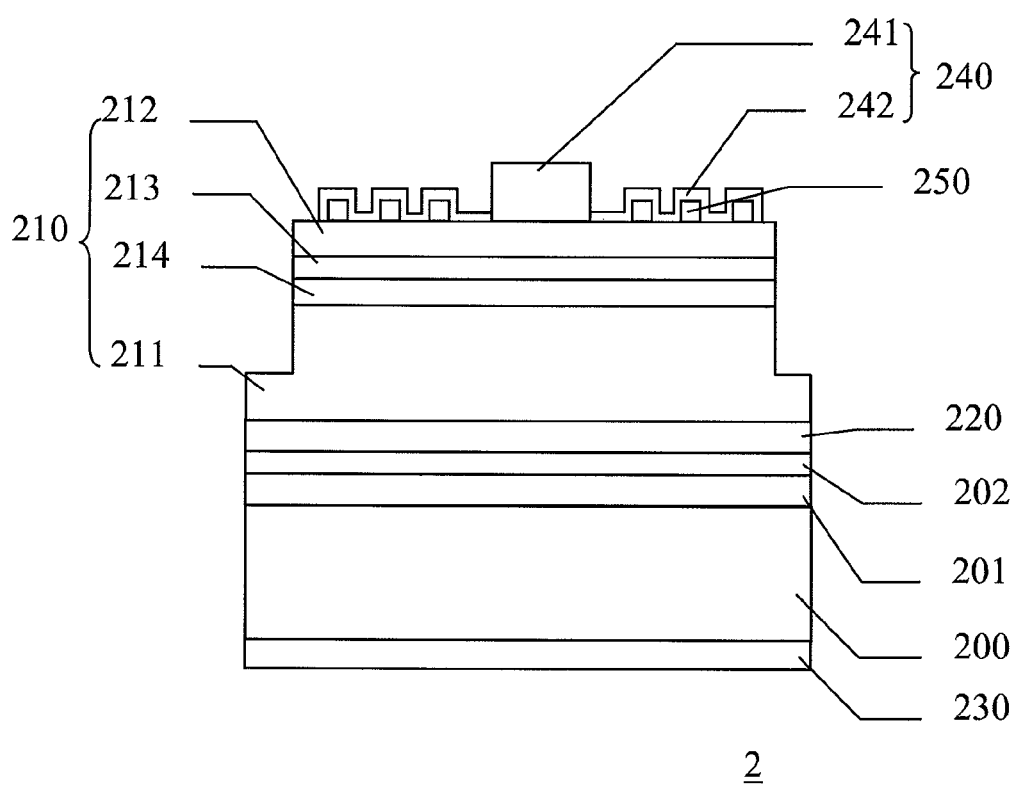
FIG. 2A is a cross-sectional view of a light-emitting device in accordance with a second embodiment of the present invention.
Figure 2B:
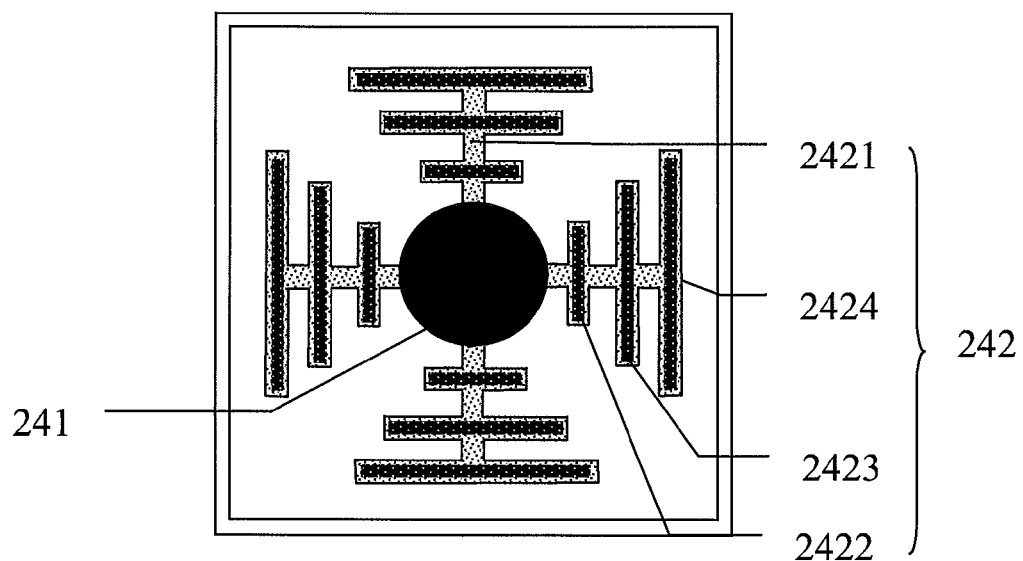
FIG. 2B is a top view of a light-emitting device in accordance with the second embodiment of the present invention.

FIGS. 2A-2B show the cross-sectional views of a light-emitting device 2 in accordance with a second embodiment of the present invention. The light-emitting device 2 includes a substrate 200, a conductive adhesive layer 201, a reflective layer 202, a first transparent conductive oxide layer 220, a semiconductor light-emitting stack 210, an electrical contact structure 250, a first electrode 230, and a second electrode 240.

The material of the substrate 200 includes but is not limited to Si, GaAs, metal or other similar materials which can mechanically support the other structure of the light-emitting device 2. The conductive adhesive layer 201 is formed on the substrate 200, and a first bonding interface is formed therebetween. The material of the conductive adhesive layer 201 includes but is not limited to Ag, Au, Al, In, spontaneous conductive polymer, or polymer doped with conductive materials like Al, Au, Pt, Zn, Ag, Ni, Ge, In, Sn, Ti, Pb, Cu, Pd, or other metals. The reflective layer 202 is formed on the conductive adhesive layer 201, and a second bonding interface is formed therebetween. The material of the reflective layer 202 includes but is not limited to metal, insulated material, or the combination thereof. The metal material for the reflective layer 202 includes Al, Au, Pt, Zn, Ag, Ni, Ge, In, Sn or alloys of the abovementioned metals. The insulated material for the reflective layer 202 includes but is not limited to $AlO_x$, $SiO_x$, or $SiN_x$. The first transparent conductive oxide layer 220 formed on the reflective layer 202 includes materials such as indium tin oxide, cadmium tin oxide, zinc oxide, or zinc tin oxide.

The semiconductor light-emitting stack 210 formed on the first transparent conductive oxide layer 220 includes a thick semiconductor layer 211, a p-type semiconductor layer 214, an n-type semiconductor layer 212, and an active layer 213 interposed therebetween. In the embodiment, the semiconductor light-emitting stack 210 is etched partially from the n-type semiconductor layer 212, the active layer 213, and the p-type semiconductor layer 214 to the thick semiconductor layer 211 to expose part of the thick semiconductor layer 211. The materials of the n-type and p-type semiconductor layers 212 and 214 include III-V group compound semiconductor materials such as AlGaInP, AlGaAs, AlGaInN or other ternary or quaternary III-V group compound semiconductor materials. The active layer 213 includes III-V group compound semiconductor materials such as AlGaInP, AlGaInN or other materials matched with the n-type and p-type semiconductor layers 212 and 214. The thick semiconductor layers 211 acts as a light extraction layer for improving the light extraction efficiency and includes materials such as GaP or GaN.

The method of forming the light-emitting device 2 includes forming a semiconductor layer on a growth substrate (not illustrated), and next forming the semiconductor light-emitting stack 210 on the semiconductor layer. After the semiconductor light-emitting stack 210 is grown, the first transparent conductive oxide layer 220 is formed on the semiconductor light-emitting stack 210, which can spread the current injected from the electrode. Next, the reflective layer 202 is formed on the first transparent conductive oxide layer 220. Then, the semiconductor light-emitting stack 210 with the first transparent conductive oxide layer 220 and the reflective layer 202, and the substrate 200 are adhered together by the adhesive layer 201.

After the adhering step, the growth substrate is removed, and the semiconductor layer is etched with a predetermined pattern. Part of the n-type semiconductor layer 212 is exposed, and the remaining semiconductor layer forms the electrical contact structure 250.

The first and second electrodes 230 and 240 are formed on the top surface of the semiconductor light-emitting stack 210 and the bottom of the substrate 200 respectively. In the embodiment, the second electrode 240 includes a current injected portion 241 and extension portions 242. In the embodiment, the current injected portion 241 is deposited approximately on the center of the semiconductor light-emitting stack 210. The extension portions 242 comprise first branches 2421 radiating from the current injected portion 241 toward the edges of the light-emitting device 2. Second branches 2422, third branches 2423, and fourth branches 2424 are diverging and extending from the first branches respectively. The second branches 2422 are deposited along with and parallel to the edges of the light-emitting device 2. The second, third and fourth branches 2422, 2423, 2424 are parallel to each other. The electrical contact structure 250 is formed between the second, third and fourth branches 2422, 2423, 2424 and the semiconductor light-emitting stack 210 respectively. In this embodiment, the material of the electrical contact structure 250 is an n-type semiconductor including III-V group compound semiconductor materials such as GaP, GaAs, GaN or other ternary or quaternary III-V group compound semiconductor materials. The second, third and fourth branches 2422, 2423, 2424 are electrical contact with the electrical contact structure 250. The first branches 2421 and the current injected portion 241 are current-blocked with the semiconductor light-emitting stack 210. The current is injected through the current injected portion 241 and moves to the first, second, third and fourth branches 2421, 2422, 2423, 2424, and then is spread to the semiconductor light-emitting stack 210 through the electrical contact structure 250. In the embodiment, the size of the light-emitting device 2 is 28 mil×28 mil, and the area of the active layer 213 is 645.16 mil$^2$. The width of each of the first branches 2421 is 0.15 mil. The width of each of the second, third and fourth branches 2422, 2423, 2424 is 0.4 mil. The width of each of the electrical contact structure 250 is 0.3 mil. The electrical contact structure 250 and the second branches have substantially the same shape. The total area of the extension portions 242 is 34.39 mil$^2$, and the total area of the contact structure 250 is 41.16 mil$^2$. The area ratio of the electrical contact structure 250 and the active layer 213 is 6.38%. The luminous efficiency of the light-emitting device 2 is 55 m/W.

In another embodiment, a structure of a light-emitting device without the conductive adhesive layer 201 and the first transparent conductive oxide layer 220 can be formed by direct bonding method with high pressure to join the semiconductor light-emitting stack 210 and the substrate 200, or join the reflective layer 202 and the substrate 200 together.

In another embodiment, a second transparent conductive oxide layer can be formed on the semiconductor light-emitting stack 210, and includes materials such as indium tin oxide, cadmium tin oxide, zinc oxide, or zinc tin oxide.

Figure 3A:
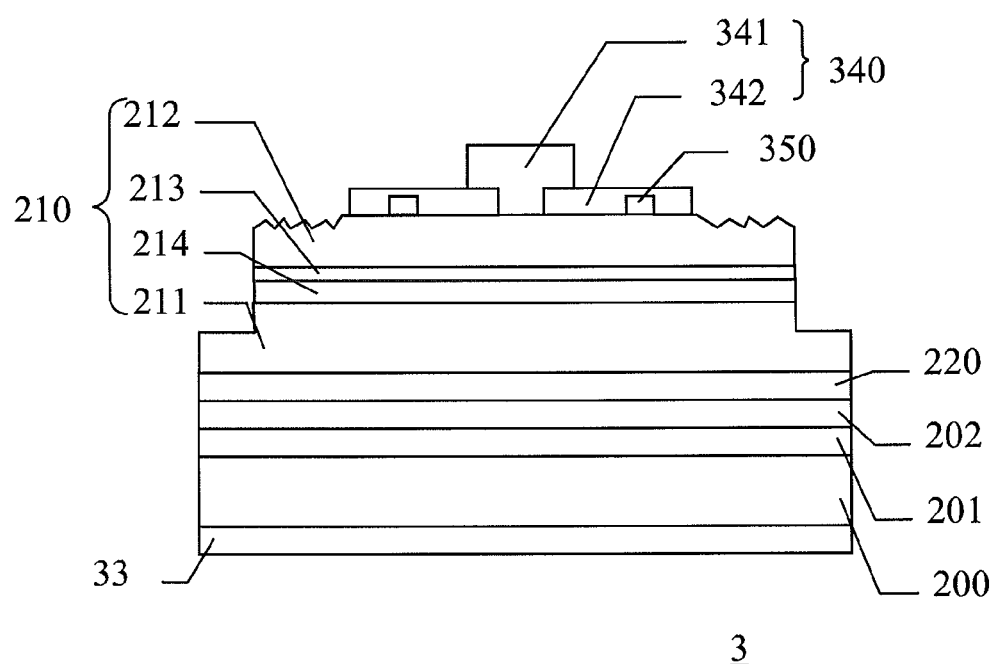
FIG. 3A is a cross-sectional view of a light-emitting device in accordance with a third embodiment of the present invention.
Figure 3B:
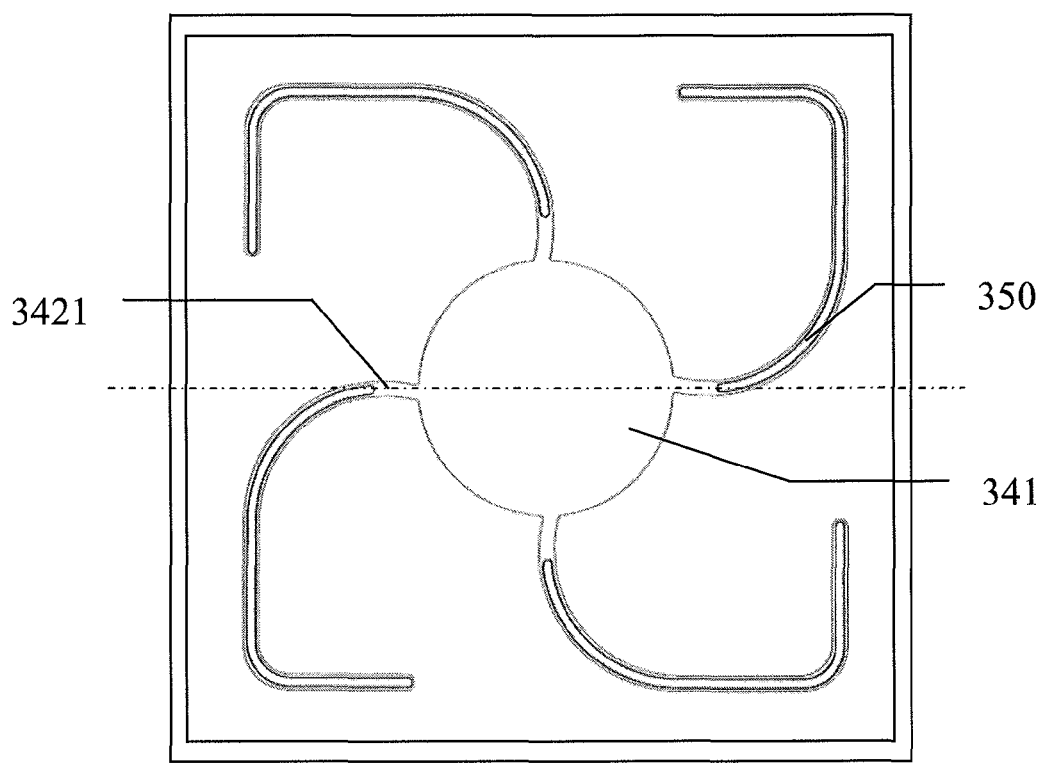
FIG. 3B is a top view of a light-emitting device in accordance with the third embodiment of the present invention.

FIGS. 3A-3B show the cross-sectional views of a light-emitting device 3 in accordance with a third embodiment of the present invention. The structure of the light-emitting device 3 is similar to the light emitting device 1, and the difference is the n-type semiconductor 212 of the light emitting device 3 includes a roughened top surface. The roughened top surface can be formed during the epitaxial process or by a randomly etching method to form a multi-cavity surface. It also can be formed by a lithographical etching to form a regular or an irregular patterned surface. The n-type semiconductor 212 also includes an even top surface. A second electrode 340 is formed on the even top surface. The second electrode 340 includes a current injected portion 341 and windmill-like extension portions 342. In the embodiment, the current injected portion 341 is deposited approximately on the center of the even top surface of the n-type semiconductor layer 212. The windmill-like extension portions 342 comprise branches 3421 radiating from the current injected portion 341 and form a windmill like shape. The branches 3421 comprise first regions and second regions, wherein the first regions are closer to the current injected portion 341 than the second regions are. There is an electrical contact structure 350 formed between second regions of branches 3421 and the semiconductor light-emitting stack 210, and the electrical contact structure 350 are ohmically contacted with the second regions of branches 3421. In this embodiment, the material of the electrical contact structure 350 is an n-type semiconductor including III-V group compound semiconductor materials such as GaP, GaAs, GaN or other ternary or quaternary III-V group compound semiconductor materials. The first regions of branches 3421 and the current injected portion 341 are current-blocked with the semiconductor light-emitting stack 210. The current is injected through the current injected portion 341 and moves to the branches 3421, and then is spread to the semiconductor light-emitting stack 210 through the electrical contact structure 350. In the embodiment, the size of the light-emitting device 3 is 14 mil×14 mil, and the area of the active layer 213 is 135 mil$^2$. The width of each of the branches 3421 is 0.25 mil. The width of each of the electrical contact structure 350 is 0.15 mil. The electrical contact structure 350 and the second regions of branches have substantially the same shape. The total area of the extension portions 342 is 8.13 mil$^2$, and the total area of the electrical contact structure 350 is 3.37 mil$^2$. The area ratio of the electrical contact structure 350 and the active layer 213 is 2.51%. The luminous efficiency of the light-emitting device 3 is 67 lm/W.

In a conventional light-emitting device, the electrical contact structure 350 is varied to be formed between the first and second regions of the extension portions 342 and the semiconductor light-emitting stack 210, the total area of the electrical contact structure 350 is 4.89 mil$^2$. The area ratio of the electrical contact structure 350 and the active layer 213 is 3.64%. The luminous efficiency of the conventional light-emitting device is 65 lm/W which is lower than that of the light-emitting device 3 in accordance with the third embodiment of the present invention.

Figure 4A:
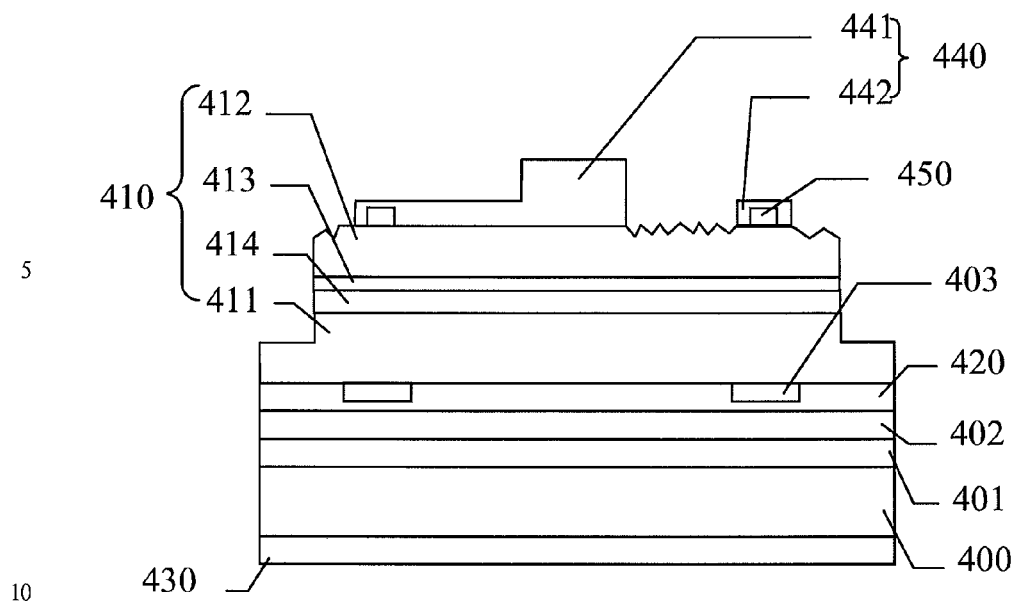
FIG. 4A is a cross-sectional view of a light-emitting device in accordance with a fourth embodiment of the present invention.
Figure 4B:
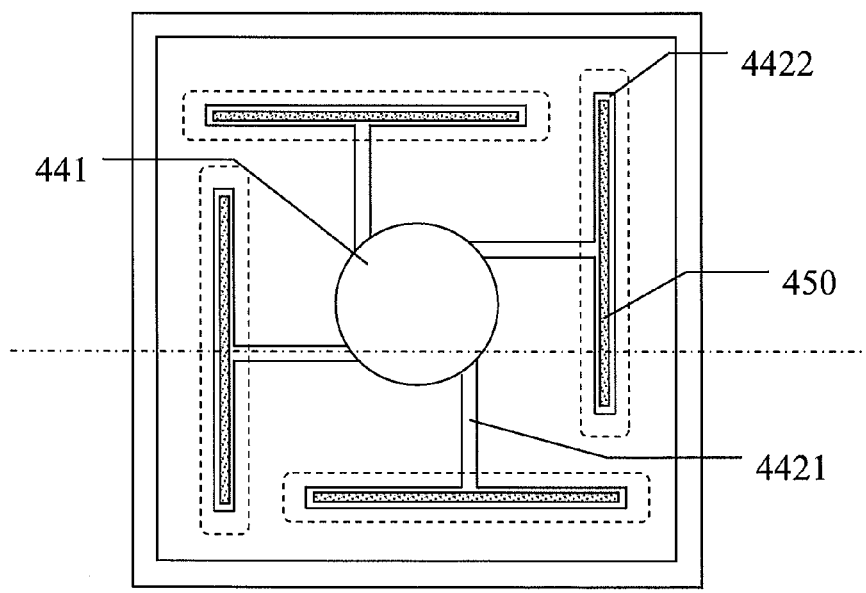
FIG. 4B is a top view of a light-emitting device in accordance with the fourth embodiment of the present invention.

FIGS. 4A-4B show the cross-sectional view of a light-emitting device 4 in accordance with a fourth embodiment of the present invention. The light-emitting device 4 includes a substrate 400, a conductive adhesive layer 401, a reflective layer 402, a first transparent conductive oxide layer 420, a semiconductor light-emitting stack 410, a current blocking structure 403 formed between the first transparent conductive oxide layer 420 and the semiconductor light-emitting stack 410, an electrical contact structure 450, a first electrode 430, and a second electrode 440. The material of the substrate 400 includes but is not limited to Si, GaAs, metal or other similar materials which can mechanically support the other structure of the light-emitting device 4. The conductive adhesive layer 401 is formed on the substrate 400, and a first bonding interface is formed therebetween. The material of the conductive adhesive layer 401 includes but is not limited to Ag, Au, Al, In, spontaneous conductive polymer, or polymer doped with conductive materials like Al, Au, Pt, Zn, Ag, Ni, Ge, In, Sn, Ti, Pb, Cu, Pd, or other metals. The reflective layer 402 is formed on the conductive adhesive layer 401, and a second bonding interface is formed therebetween. The material of the reflective layer 402 includes but is not limited to metal, oxide, or the combination thereof. The metal material for the reflective layer 402 includes Al, Au, Pt, Zn, Ag, Ni, Ge, In, Sn or alloys of the abovementioned metals. The first transparent conductive oxide layer 420 is formed on the reflective layer 402, and includes but is not limited to indium tin oxide, cadmium tin oxide, zinc oxide, or zinc tin oxide. The material of current blocking structure 403 includes but is not limited to $AlO_x$, $SiO_x$, $SiN_x$, or metal. The metal of the current blocking structure 403 is selected from material capable of forming a Schottky contact with the first transparent conductive oxide layer 420. The semiconductor light-emitting stack 410 is formed on the first transparent conductive oxide layer 420, including a thick semiconductor layer 411, a p-type semiconductor layer 414, an n-type semiconductor layer 412, and an active layer 413 interposed therebetween. In the embodiment, the semiconductor light-emitting stack 410 is etched partially from the n-type semiconductor layer 412, the active layer 413, and the p-type semiconductor layer 414 to the thick semiconductor layer 411 to expose part of the thick semiconductor layer 411. The n-type semiconductor 412 of the light emitting device 4 includes a roughened top surface. The materials of the n-type and p-type semiconductor layers 412 and 414 include III-V group compound semiconductor materials such as AlGaInP, AlGaAs, AlGaInN or other ternary or quaternary III-V group compound semiconductor materials. The active layer 413 includes III-V group compound semiconductor materials such as AlGaInP, AlGaInN or other materials matched with the n-type and p-type semiconductor layers 412 and 414. The thick semiconductor layers 411 acts as a light extraction layer for improving the light extraction efficiency and includes materials such as GaP or GaN.

The method of forming the light-emitting device 4 includes forming a semiconductor layer on a growth substrate (not illustrated), forming the semiconductor light-emitting stack 410 on the semiconductor layer, forming current blocking structure 403 on the semiconductor light-emitting stack 410, forming the first transparent conductive oxide layer 420 on the semiconductor light-emitting stack 410 and current blocking structure 403 with a first predetermined pattern, and forming the reflective layer 402 on the first transparent conductive oxide layer 420 to form a first stack. Next the first stack and the substrate 400 are adhered together by the adhesive layer 401.

After the adhering step, the growth substrate is removed, and the semiconductor layer is etched in accordance with a second predetermined pattern to expose part of the n-type semiconductor layer 412, and the remaining semiconductor layer forms the electrical contact structure 450. In this embodiment, the material of the electrical contact structure 450 is an n-type semiconductor including III-V group compound semiconductor materials such as GaP, GaAs, GaN or other ternary or quaternary III-V group compound semiconductor materials.

The first and second electrodes 430 and 440 are formed on the top surface of the semiconductor light-emitting stack 410 and the electrical contact structure 450, and the bottom of the substrate 400 respectively. In the embodiment, the second electrode 440 includes a current injected portion 441 and extension portions 442. In the embodiment, the current injected portion 441 is deposited approximately on the center of semiconductor light-emitting stack 410. The extension portions 442 comprise first branches 4421 radiating from the current injected portion 441 toward the edges of the light-emitting device 4. Second branches 4422 are diverging and extending from the first branches 4421. The second branches 4422 are deposited along with and parallel to the edges of the light-emitting device 4. The electrical contact structure 450 is formed between the second branches 4422 and the semiconductor light-emitting stack 410. The second predetermined pattern of the electrical contact structure 450 is similar to that of the second branches 4422. The second branches 4422 are electrically contacted with the electrical contact structure 450. The first branches 4421 and the current injected portion 441 are current-blocked with the semiconductor light-emitting stack 410.

The current blocking structure 403 is deposited under the second branches 4422 and between the p-type semiconductor layer 414 and the first transparent conductive oxide layer 420. The first predetermined pattern of the current blocking structure 403 is similar to that of the electrical contact structure 450, and the width of the current blocking structure 403 is larger than that of the electrical contact structure 450 so the area of the current blocking structure 403 is larger than that of the electrical contact structure 450. The current is injected through the current injected portion 441 and moves to the first and second branches 4421, 4422 and then is spread to the semiconductor light-emitting stack 410 through the electrical contact structure 450. The current is blocked by the current blocking structure 403 so there is less light generated by the active layer under the second branches 4422 and less light is absorbed by the second branches 4422.

In the embodiment, the size of the light-emitting device 4 is 14 mil×14 mil, and the area of the active layer 413 is 135 $mil^2$. The width of each of the first branches 4421 is 0.14 mil, and the width of each of the second branches 4422 is 0.24 mil. The width of each of the electrical contact structure 450 is 0.14 mil, and the width of each of the current blocking structure 403 is 0.12 mil.

The electrical contact structure 450 and the second branches have substantially the same shape. The total area of the extension portions 442 is 8.83 $mil^2$, and the total area of the contact structure 450 is 4.26 $mil^2$. The area ratio of the electrical contact structure 450 and the active layer 413 is 3.16%. The luminous efficiency of the light-emitting device 4 is 80 lm/W.

It will be apparent to a person having ordinary skill in the art that various modifications and variations can be made to the structure of the present invention without departing from the scope or spirit of the invention. In view of this, it is intended that the present invention covers modifications and variations of this invention provided they fall within the scope of the following claims and their equivalents.

What is claimed is:
1. A light-emitting device comprising:
a semiconductor light-emitting stack comprising a center and an edge;
a current injected portion on an upper surface of the semiconductor light-emitting stack, and located near the center of the upper surface of semiconductor light-emitting stack; and an extension portion on the semiconductor light-emitting stack, wherein the extension portion comprises multiple first branches, multiple second branches cross the first branches, and multiple third branches parallel to the edge, wherein one end of each first branch is connected with the current injected portion, and the other end of each first branch is connected with one of the third branches, and wherein a length of one of the multiple third branches is greater than that of one of the multiple second branches.

2. The light-emitting device of claim 1, wherein one of the multiple second branches comprises a first short branch and a first long branch having a length between that of the first short branch and that of the third branch.

3. The light-emitting device of claim 2, wherein the first short branch is closer to the current injected portion than the first long branch.

4. The light-emitting device of claim 1, wherein the multiple second branches are parallel to the edge.

5. The light-emitting device of claim 1, wherein the multiple third branches are separated from each other.

6. The light-emitting device of claim 5, wherein the multiple third branches are separated from each other along a diagonal line of the upper surface.

7. The light-emitting device of claim 1, wherein the multiple third branches are formed along the edge.

8. The light-emitting device of claim 1, wherein the multiple second branches are separated from each other.

9. The light-emitting device of claim 8, wherein the multiple second branches are separated from each other along a diagonal line of the upper surface.

10. The light-emitting device of claim 1, wherein the multiple first branches, the multiple second branches, and the multiple third branches are substantially formed concentrically.

11. The light-emitting device of claim 1, wherein one of the multiple first branches is perpendicular to one of the multiple third branches and one of the multiple second branches.

12. The light-emitting device of claim 1, further comprising an electrical contact structure between the semiconductor light-emitting stack and the extension portion.

13. The light-emitting device of claim 12, wherein a width of the electrical contact structure is not larger than that of one of the multiple second branches or one of the multiple third branches.

14. The light-emitting device of claim 1, wherein the multiple first branches form a cross, and an intersection of the cross substantially at the center of the upper surface of semiconductor light-emitting stack.

15. The light-emitting device of claim 1, further comprises a substrate, a conductive adhesive layer between the substrate and the semiconductor light-emitting stack, and a reflective layer between the conductive adhesive layer and the semiconductor light-emitting stack.

16. The light-emitting device of claim 15, wherein the conductive adhesive layer comprises Al, Au, Pt, Zn, Ag, Ni, Ge, In, Sn, Ti, Pb, Cu, Pd, or other metal.

17. The light-emitting device of claim 15, wherein the reflective layer comprises Al, Au, Pt, Zn, Ag, Ni, Ge, In, Sn or alloy thereof.

18. The light-emitting device of claim 15, further comprises a current blocking structure between the reflective layer and the semiconductor light-emitting stack.

19. The light-emitting device of claim 1, the upper surface of the semiconductor light-emitting stack is roughened.

\* \* \* \* \*